(12) United States Patent
Luo et al.

(10) Patent No.: US 10,831,330 B2
(45) Date of Patent: Nov. 10, 2020

(54) STRUCTURED HIERARCHICAL TEMPLATES FOR MODELING ASSET INSTANCES

(71) Applicant: General Electric Company, Schenectady, NY (US)

(72) Inventors: Guiluan Luo, Dublin, CA (US); Scott McCluskey, San Ramon, CA (US)

(73) Assignee: General Electric Company, Schenectady, NY (US)

(*) Notice: Subject to any disclaimer, the term of this patent is extended or adjusted under 35 U.S.C. 154(b) by 484 days.

(21) Appl. No.: 15/691,597

(22) Filed: Aug. 30, 2017

(65) Prior Publication Data

US 2019/0065006 A1 Feb. 28, 2019

(51) Int. Cl.
*G06F 16/955* (2019.01)
*G06F 3/0481* (2013.01)
*G06Q 10/00* (2012.01)
*G06Q 10/08* (2012.01)
*G06F 30/00* (2020.01)

(52) U.S. Cl.
CPC .......... *G06F 3/0481* (2013.01); *G06F 16/955* (2019.01); *G06F 30/00* (2020.01); *G06Q 10/087* (2013.01); *G06Q 10/20* (2013.01)

(58) Field of Classification Search
CPC ...... G06F 3/0481; G06F 17/50; G06F 16/955; G06Q 10/087; G06Q 10/20
See application file for complete search history.

(56) References Cited

U.S. PATENT DOCUMENTS

| 2010/0145492 | A1* | 6/2010 | Russell | G06F 17/50 700/103 |
| 2012/0010739 | A1* | 1/2012 | Elisma | G06F 17/50 700/98 |
| 2018/0165619 | A1* | 6/2018 | Hilerio | G06Q 10/0875 |

* cited by examiner

*Primary Examiner* — Khanh B Pham
(74) *Attorney, Agent, or Firm* — Fitch Even Tabin & Flannery LLP

(57) ABSTRACT

Aspects of the present disclosure involve a system comprising a computer-readable storage medium storing at least one program, and a method for generating an asset template. The method may include receiving asset type descriptive data from a client machine, creating an asset template for the asset type based on the asset type descriptive information, and storing the asset template in a network-based database. The creating of the asset template may include defining components of the asset type and a configuration of the components.

17 Claims, 15 Drawing Sheets

FIG. 8B

< ALL TEMPLATES     TEMPLATES     +

CATERPILLAR 798 [V 0.0 ▼] [PUBLISHED▼]     LIFECYCLE STAGE: MANUFACTURING▼

OFF-HIGHWAY, ULTRA CLASS, TWO-AXLE, MECHANICAL POWERTRAIN HAUL TRUCKS FOR HIGH-PRODUCTION MINING AND HEAVY-DUTY CONSTRUCTION.

MBOM    VENDORS

▽ CABIN
    STEERING WHEEL
    IGNITION CONTROL
    DOOR
▷ ENGINE
▷ WHEELS
    THRUST
▷ SECONDARY MODULE
    PART X
    LOREM IPSUM DOLOR PART

DOOR

MANUFACTURER DETAILS

| ATTRIBUTE NAME | VALUE |
|---|---|
| FACILITY | VIRGINIA |
| MANUFACTURER | CATERPILLAR LLC |
| BATCH | 34-322-3232-1 |
| MANUFACTURE DATE | 04/16/2015 01:28:00 PM EST |

INVENTORY

| QUANTITY | WAREHOUSE ID | LOCATION | LOCATION | ACTIONS |
|---|---|---|---|---|
| 50 | ID-1234-1213231 | WASHINGTON | WASHINGTON | REQUEST INVENTORY |
| 43 | ID-1234-1837323 | NORTH DAKOTA | NORTH DAKOTA | REQUEST INVENTORY |
| 43 | ID-1234-1294949-99 | INDIANA | INDIANA | REQUEST INVENTORY |
| 76 | ID-1234-1213231 | BERLIN | BERLIN | REQUEST INVENTORY |

*FIG. 8D*

INSTANCES

⊘ CAT-798-T23 [WARNING ˅]

OFF-HIGHWAY, ULTRA CLASS, TWO-AXLE, MECHANICAL POWERTRAIN HAUL TRUCKS FOR HIGH-PRODUCTION MINING AND HEAVY-DUTY CONSTRUCTION.

LIFECYCLE STAGE: IN OPERATION ˜

OVERVIEW ATTRIBUTES LOCATION CONFIGURATION TAGS DOCUMENTS EVENTS HISTORY

EQUIPMENT DETAILS

| | |
|---|---|
| FAMILY TYPE | OFF-HIGHWAY ULTRA CLASS |
| EQUIPMENT TYPE | HAUL TRUCK |
| MAKE | CATERPILLAR |
| MODEL | CATERPILLAR-798 |
| SERIES | HEAVY DUTY SERIES |
| SERIAL NUMBER | SN-23453543524 |
| CRITICALITY RISK SCORE | 350.1 |

COVERAGE — LOW

UTILIZATION

| REMAINING USEFUL LIFE | CYCLE SINCE LAST MAINT. | CYCLE SINCE NEW |
|---|---|---|
| 7500 CYCLES | 55 CYCLES | 587 CYCLES |

EVENTS

CURRENT LOCATION

| LATITUDE | 134 |
|---|---|
| LONGITUDE | 72 |
| ALTITUDE | 21 |

Q SEARCH
▸ MINE 20
▾ MINE 22
  ▸ BLOCK 1
    ⊘ CAT-342-T32
    ⊘ BELAZ-233-T1
    ⊘ BELAZ-233-T2
▾ MINE 23
  ▸ ⊘ CAT-798-T17
  ▾ ⊘ CAT-798-T23
    ⊘ CABIN
    ⊘ DOOR
    ⊘ WHEEL
    ⊘ WHEEL
    ⊘ WHEEL
    ⊘ PLATFORM BASE LAYER 1234:21343
    ⊘ ACCESS POINT
    ⊘ LIGHTS
  ⊘ CAT-798-T35
▸ MINE DAKOTA
▸ MINE DAKOTA
▸ MINE DAKOTA

*FIG. 8F*

INSTANCES

⊘ CAT-798-T23 WARNING ⌄      LIFECYCLE STAGE: IN OPERATION ⌄

OFF-HIGHWAY, ULTRA CLASS, TWO-AXLE, MECHANICAL POWERTRAIN HAUL TRUCKS FOR HIGH-PRODUCTION MINING AND HEAVY-DUTY CONSTRUCTION.

OVERVIEW   ATTRIBUTES   LOCATION   CONFIGURATION   TAGS   DOCUMENTS   EVENTS   HISTORY

EQUIPMENT DETAILS

| TIMESTAMP | EVENT TYPE | EVENT TYPE | DESCRIPTION | |
|---|---|---|---|---|
| FILTER | FILTER | FILTER | FILTER | |
| 2014-02-17, 19:33:51 | MAINTENANCE | ROUTINE MAINTENANCE | PLANNED MAINTENANCE @20000 MILES | ACTIONS ⌄ |
| 2014-02-18, 19:33:51 | ALERT | AXLE CHANGED | WHEEL MODEL WH-214-21 REPLACED | ACTIONS ⌄ |
| 2014-02-19, 19:33:51 | ALERT | TRUCK IN POT HOLE | TIRE SHOWS PROBLEM AFTER FALLING INTO POTHOL | ACTIONS ⌄ |
| 2014-02-20, 19:33:51 | REPLACED AXLE | NO MOTION DETECTED | ROUTINE CLEANING (3MONTH WASH) | ACTIONS ⌄ |
| 2014-02-21, 19:33:51 | ALERT | STOPPED OPERATION | TRUCK OUT OF SERVICE DURING HEAVY RAIN | ACTIONS ⌄ |
| 2014-02-22, 19:33:51 | MAINTENANCE | ROUTINE MAINTENANCE | PLANNED MAINTENANCE @5000 MILES | ACTIONS ⌄ |
| 2014-02-23, 19:33:51 | MAINTENANCE | TIRE CHANGED | WHEEL MODEL WH-214-22 REPLACED | ACTIONS ⌄ |
| 2014-02-24, 19:33:51 | MAINTENANCE | WATER WASH | TIRE SHOWS PROBLEM AFTER FALLING INTO POTHOL | ACTIONS ⌄ |
| 2014-02-25, 19:33:51 | UNPLANNED EVENT | UNPLANNED EVENT | ROUTINE CLEANING (3MONTH WASH) | ACTIONS ⌄ |
| 2014-02-26, 19:33:51 | ALERT | TRUCK IN POT HOLE | TRUCK OUT OF SERVICE DURING HEAVY RAIN | ACTIONS ⌄ |

ROWS PER PAGE [10 ⌄]    11-20 OF 80   < 1 ②  3  4  5 ... 8

Sidebar:
- 🔍 SEARCH
- ▷ MINE 20
- ▽ MINE 22
  - ▷ BLOCK 1
    - ⊘ CAT-342-T32
    - ⊘ BELAZ-233-T1
    - ⊘ BELAZ-233-T2
- ▽ MINE 23
  - ▷ ⊘ CAT-798-T17
  - ▽ ⊘ CAT-798-T23
    - ⊘ CABIN
    - ⊘ DOOR
    - ⊘ WHEEL
    - ⊘ WHEEL
    - △ ⊘ ENGINE
  - ⊘ CAT-798-T35
- △ MINE DAKOTA
- △ MINE DAKOTA
- △ MINE DAKOTA
- ▷ BIZ HIERARCHY NAME 2

*FIG. 8G*

STRUCTURED HIERARCHICAL TEMPLATES FOR MODELING ASSET INSTANCES

TECHNICAL FIELD

The subject matter disclosed herein relates to asset lifecycle management. In particular, example embodiments may relate to systems and methods for generating structured hierarchical templates for modeling asset instances.

BACKGROUND

Asset lifecycle management (ALM) is a process for optimizing management of complex and high-value industrial assets. ALM generally consists of systems and techniques that aid in the management of complex assets beyond a single organization to the entire ecosystem responsible in the lifecycle of the asset. Traditional approaches to ALM typically involve creation of computer models that are used to monitor and track individual assets throughout their lifetime. Conventional modeling techniques require users to specify each individual component or part of each individual asset instance along with the configuration of the components and parts. For assets with a large number of parts and components that are manufactured on a large scale (e.g., where many instances of the same equipment are made), the traditional approach to modeling can be a time consuming and costly process that is frequently repeated.

BRIEF DESCRIPTION OF THE DRAWINGS

Various ones of the appended drawings merely illustrate example embodiments of the present inventive subject matter and cannot be considered as limiting its scope.

FIGS. 8A-8G are interface diagrams illustrating example interactive interfaces provided by the network-based ALM system, according to some embodiments.

DETAILED DESCRIPTION

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

Aspects of the present disclosure involve systems and methods for generating structured hierarchical asset templates. In the context of this disclosure, an asset template is a data structure that acts as a placeholder to be populated with more specific information to model instances of an asset of a particular type (e.g., a particular model of equipment). Each template specifies components and subcomponents for the type of asset along with the configuration (e.g., position and structure) of the components and subcomponents. Asset templates include attributes for describing various characteristics of assets of the corresponding asset type. Additionally, asset templates may further include an association with multiple sensor measurements. Although the asset templates of the present disclosure may find particularly suitable application in modeling of physical equipment and are therefore described herein using examples thereof, it shall be appreciated that the templates are not limited to this class of assets and may find application in modeling other classes of assets such as networks of devices or business functions.

Consistent with some embodiments, a method for generating an asset template may include receiving asset type descriptive data from a client machine, creating an asset template for the asset type based on the asset type descriptive information, and storing the asset template in a network-based database. The creating of the asset template may include defining components, subcomponents, and attributes as well as defining a configuration of component and subcomponent for the asset type. The creation of the asset template may further include associating one or more sensor measurements with the asset type.

Figure 1:
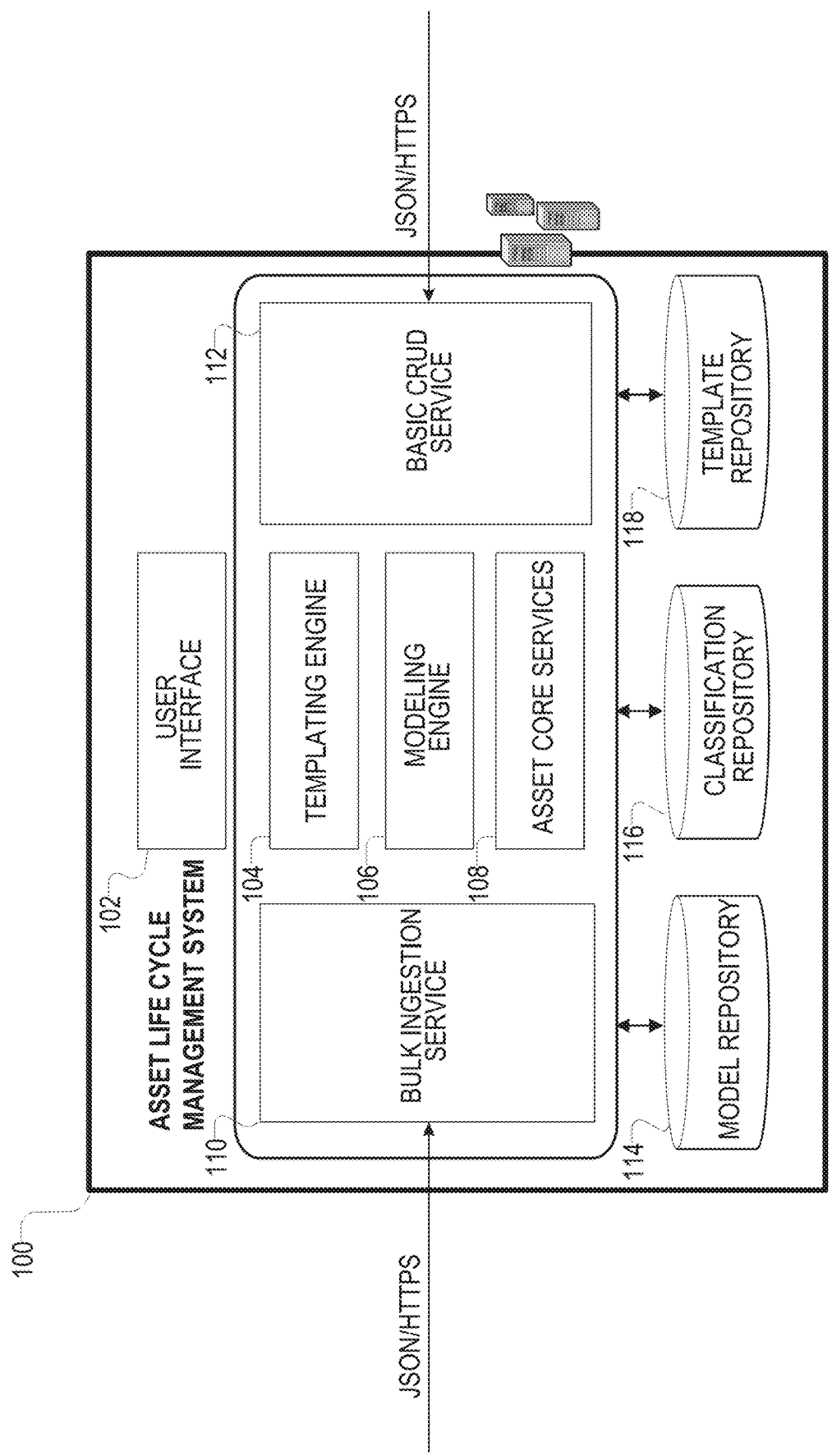
FIG. 1 is an architecture diagram illustrating a network-based asset lifecycle management (ALM) system, within which a templating engine may be deployed, according to some embodiments.

With reference to FIG. 1, an example architecture of a network-based ALM system 100 is shown, according to some embodiments. To avoid obscuring the inventive subject matter with unnecessary detail, various functional components (e.g., services and engines) that are not germane to conveying an understanding of the inventive subject matter have been omitted from FIG. 1. However, a skilled artisan will readily recognize that various additional functional components may be supported by the network-based ALM system 100 to facilitate additional functionality that is not specifically described herein.

As is understood by skilled artisans in the relevant computer arts, the functional components illustrated in FIG. 1 represent a set of executable software instructions and the corresponding hardware (e.g., memory and processor) for executing the instructions. Furthermore, the various functional components depicted in FIG. 1 may reside on a single computer (e.g., a laptop), or may be distributed across several computers in various arrangements, such as cloud-based architectures. Moreover, it shall be appreciated that while the functional components (e.g., services and engines) of FIG. 1 are discussed in the singular sense, in other embodiments, multiple instances of one or more of the components may be employed.

As illustrated in FIG. 1, the network-based ALM system 100 includes a user interface module 102, a templating engine 104, a modeling engine 106, asset core services 108, a bulk ingestion service 110, and a create, read, update, and delete (CRUD) service 112 all configured to be in communication with each other (e.g., via a bus, a shared memory, a network, or a switch) so as to allow information to be passed between the functional components or so as to allow the functional components to share and access common data. Additionally, each of the functional components illustrated in FIG. 1 may access and retrieve data from a classification repository 116, a template repository 118, or a model repository 114.

The user interface module 102 is responsible for presenting information and handling user interactions related to the functions of the network-based ALM system 100. Accordingly, the interface module 102 may provide a number of interfaces to users (e.g., interfaces that are presented on a computing system operated by the user) that allow the users to view, create, edit, and delete templates and models. To this end, the interfaces provided by the user interface module 102 may include one or more graphical interface elements (e.g., buttons, toggles, switches, drop-down menus, or sliders) that may be manipulated through user input to perform various operations associated with the functioning of the network-based ALM system 100. For example, the user interface module 102 may provide an interface element that allows users to provide asset type descriptive data to be used in generating templates. The interface module 102 also receives and processes user input received through such interface elements.

In addition to being able to view, create, edit, and delete templates and models through user interfaces provided by the user interface module 102, client devices may further submit, via a network connection with the network-based ALM system 100, appropriately formatted requests (e.g., application programming interface (API) requests) to the CRUD service 112 to create, read, update, and delete templates and models. Similarly, using the bulk ingestion service 110, client devices may submit, via a network connection with the network-based ALM system 100, requests (e.g., API requests) to create templates and models in bulk.

The templating engine 104 is responsible for creating templates. A template in the context of this disclosure is a hierarchical data structure that specifies components, subcomponents, attributes, and sensor measurements for the asset type along with the configuration (e.g., structure and placement) of the components and subcomponents for the asset type. Each template may further include a three-dimensional representation of the asset type. Each of the specified components, subcomponents, attributes, and sensor measurements include placeholders which may be populated with specific information (e.g., serial numbers or other unique identifiers) by the modeling engine 106 when creating asset model instances.

A model instance is a data structure that represents an individually identifiable asset that is of the asset type of the corresponding asset template from which the model instance was created. In an example, an equipment template corresponding to a particular type of equipment (e.g., a specific version of the equipment) is created, and from the equipment template, a model instance may be created to represent an individual instance of the equipment type that is identifiable by its unique serial number. As noted above, the modeling engine 106 creates asset model instances by populating the placeholders for components, subcomponents, attributes, and sensor measurements. In an example, a template representing a particular type of fan module (e.g., a specific version identified by model number) may have placeholders for each of the fans blades (e.g., a specific version identified by model number), and in instantiating an model instance for the fan module, the modeling engine 106 may populate the fan blade placeholders with a particular serial number or unique identifier of each fan blade included in the corresponding instance of the fan module. The modeling engine 106 may populate templates with information supplied via a user interface provided by the user interface module 102 or via an API request submitted to the bulk ingestion service 110 or the CRUD service 112.

The asset core services 108 include computer-implemented services that are designed to aid in managing complex industrial assts. For example, the asset core services 108 may allow users to configure asset parameters, track events in the lifecycle of an asset such as maintenance and repairs, monitor sensors that measure on-going performance characteristics of assets, and create reports regarding performance of assets. Additionally, the asset management services 108 may provide users with the ability to create rules that will trigger actions when certain conditions are met. For example, users may create rules that cause alerts to be sent out when sensor measurement values of an asset exceed a threshold.

As shown, a data layer of the network-based ALM system 100 includes the classification repository 116, the template repository 118, and the model repository 114. The classification repository 116 stores data structures referred to as asset classifications, which are used to classify common classes of component and subcomponent types. Asset classifications may be used by the templating engine 104 to determine attributes for components and subcomponents in generating asset templates. Accordingly, each asset classification may contain a set of attributes that are common to all members (e.g., components and subcomponents) of the class. Members of the asset class may include asset subclasses as well as specific asset types. A parent-child hierarchical representation of asset classifications enforces an attribute inheritance policy which is from parent to the child (top-down) asset-classifications.

Figure 2:
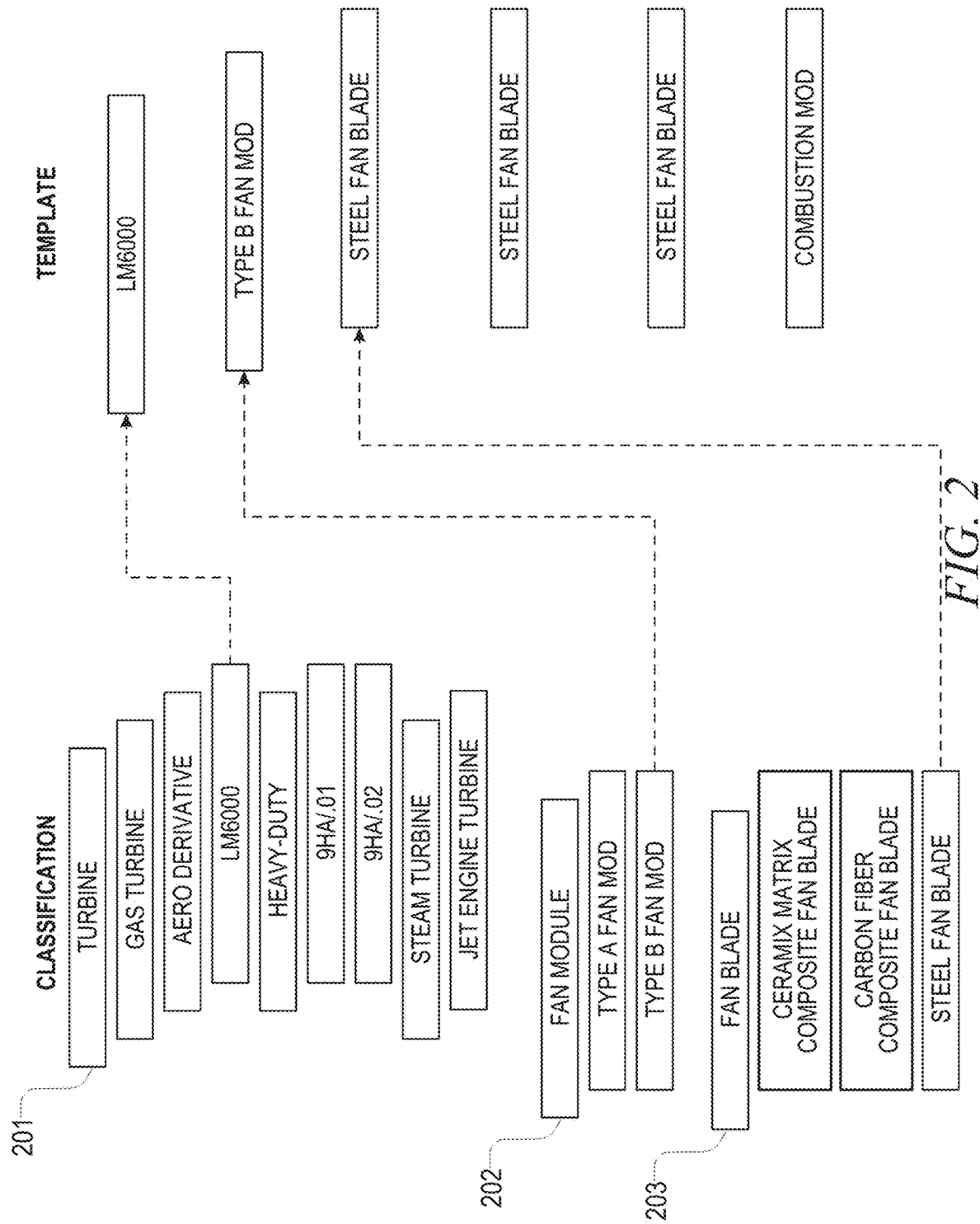
FIG. 2 is a conceptual diagram illustrating inheritance of attributes for components and subcomponents of a common class, according to some embodiments.

For example, FIG. 2 is a conceptual diagram illustrating an inheritance of attributes for components and subcomponents of a common class, according to some embodiments. Shown in FIG. 2 are multiple classifications 201-203. Classification 201 corresponds to a "Turbine" class. Within the "Turbine" class are sub-classes for "Gas Turbine," "Steam Turbine," and "Jet Engine Turbine," and within the sub-class of "Gas Turbines" are types of "Gas Turbines"—"Aero derivative" and "Heavy-Duty." Each of the types of "Gas Turbines" include further sub-types—namely "LM6000" for "Aero derivative" and "9HA/.01" and "9HA/.02." Each member of the "Turbine" class from the sub-class through to sub-types—inherit the specified attributes from the "Turbine" class, which would be attributes common to all turbines. Further, the types of "Gas Turbines" (i.e., "Aero derivative" and "Heavy-Duty") inherit attributes from the subclass "Gas Turbines," which are common attributes for all gas turbines. Further still, the sub-types of "Aero derivative" and "Heavy-duty" turbines inherit the attributes that are common to those types of turbines. Accordingly, in the example illustrated in FIG. 2, in generating a template for a particular asset type, the templating engine 104 may define the sub-type "LM6000" aero derivative gas turbine as a component of the corresponding asset type. In this example, the templating engine 104 defines the attributes of that component in accordance with the chain of inheritance described above.

As another example, classification 202 corresponds to a "Fan Module" class. Within the "Fan Module" class are types of fan modules—"Type A Fan module" and "Type B fan module." In this example, the types of fan modules, which may have their own more specific attributes, inherit the attributes specified for the class "Fan Module." Accordingly, in the example illustrated in FIG. 2, in generating the template, the templating engine 104 may define the "Type B Fan Module" as a component of the corresponding asset type. In this example, the templating, engine 104 defines the attributes of the "Type B Fan Module" in accordance with the chain of inheritance described above.

As yet another example, classification 203 corresponds to a "Fan Blade" class. Within the "Fan Blade" class are types of fan blades "Ceramix Matrix Composite Fan Blade," "Carbine Fiber Composite Fan Blade," and "Steel Fan Blade." Each of the types of fan blades inherit the specified attributes of the "Fan Blade" class. Accordingly, in the example illustrated in FIG. 2, in generating the template, the templating engine 104 may define the "Steel Fan Blade" as a subcomponent of the fan module. In this example, the templating engine 104 defines the attributes of these subcomponents in accordance with the chain of inheritance described above.

Returning to FIG. 1, the template repository 116 stores asset templates generated by the templating engine 104. As noted above, an asset template is a hierarchical data structure that specifies the components, subcomponents, configuration, attributes, and sensor measurements of an asset type. Because each components and subcomponents corresponds to an asset classification, the asset template may be considered a compilation of asset classifications where the asset-classifications are connected in a parent-child relationships according to the determined configuration of the asset type. These relationships may include attributes to describe positions of each component or subcomponent. For example, fan blades are a subcomponent of a fan module, which may be a component of a specific type of jet engine, and each fan blade may have an attribute to specify its relative position within the fan module even though each fan blade is specified to be the same type (e.g., the same make and model).

Figure 3:
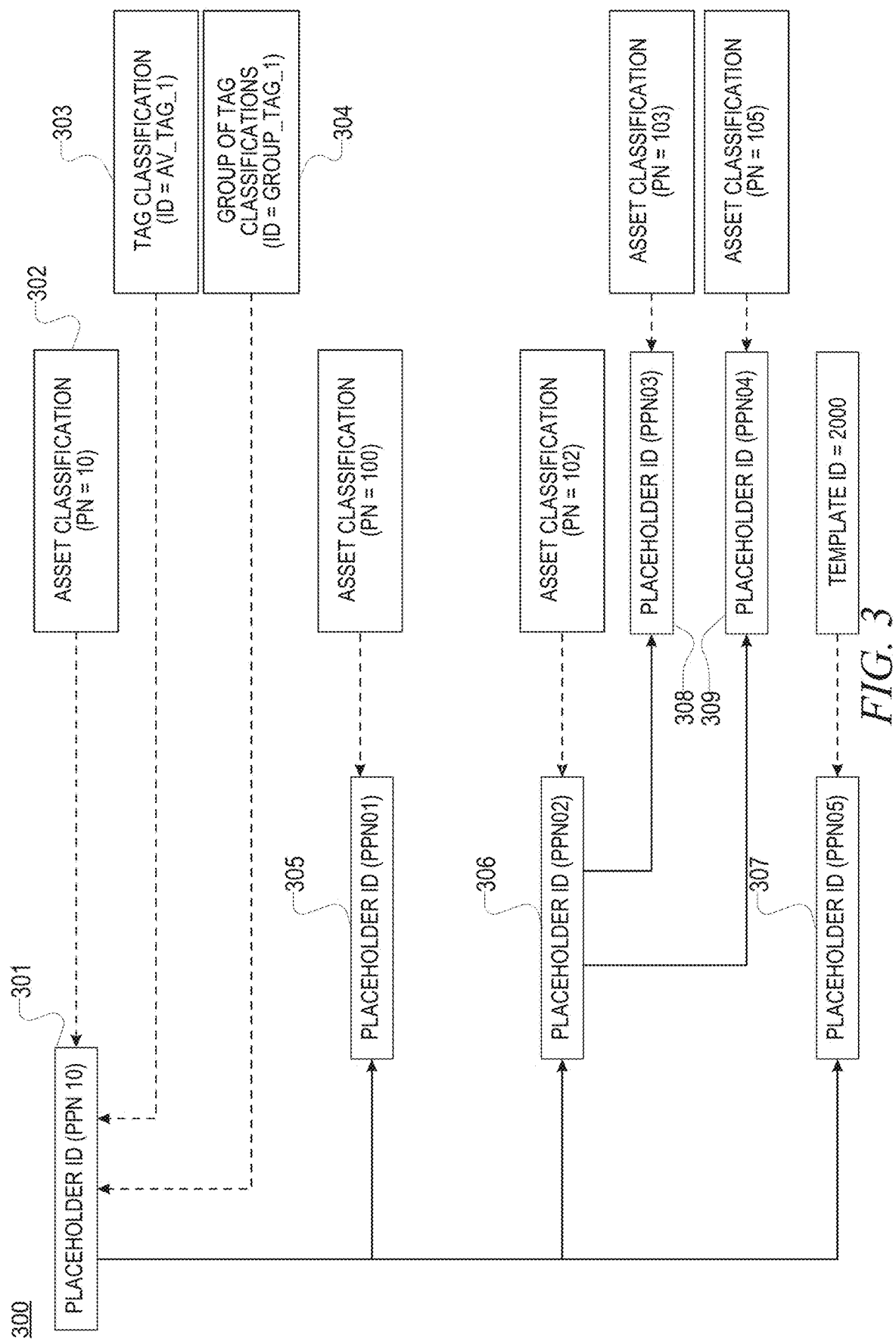
FIG. 3 is a block diagram illustrating a general example data structure that underlies an asset template, according to some embodiments.

As noted above, the components and subcomponents specified in an asset template serve as placeholders to be populated with more specific information such as serial numbers and other unique identifiers when instantiating an instance of an asset model from the template. As an example, FIG. 3 is a block diagram illustrating a general example data structure underlying an asset template 300, according to some embodiments. As shown, the asset template 300 is a hierarchical data structure comprising multiple elements organized in parent-child relationships, where the elements correspond to components and subcomponents of the asset type. The asset template 300 includes a global element 301, which includes a placeholder for specifying a unique identifier for a specific instance of the asset type such as a serial number. In the example shown in FIG. 3, the asset type of the asset template 300 is associated with asset classification 302, and as such, the asset template 300 will inherit attributes from the classification 302 as will the components and subcomponents of the asset template 300, Additionally, sensor measurements 303 and 304 are associated with the template 300.

The asset template 300 comprises elements for components 305-307. The elements for components 305 and 306 correspond to a particular asset classification and thus, inherit the attributes of their respective asset classification. The element for component 307 corresponds to another asset template "Template ID=2000"). Each of the elements for components 305-307 are placeholders to be populated with more specific information about the components, such as serial numbers. As shown, the component 306 includes elements for subcomponents 308 and 309, each of which corresponds to a particular asset classification and thus, inherit the attributes from their respective asset classification.

Returning to FIG. 1, the model repository 114 stores asset model instances. Each asset model instance is a data structure created from a template that represents a real-world asset that is an instance of the asset type corresponding to the template. Each such real-world asset may be uniquely identified by serial number or other identifier and includes specific characteristics (e.g., represented by attribute key-value pairs) such as dimension, material type, color and the like. The modeling engine 106 creates asset model instances by populating the placeholders of templates with specific information such as unique identifiers (e.g., serial numbers) of components, subcomponents, and sensors and specific attribute values.

Figure 4:
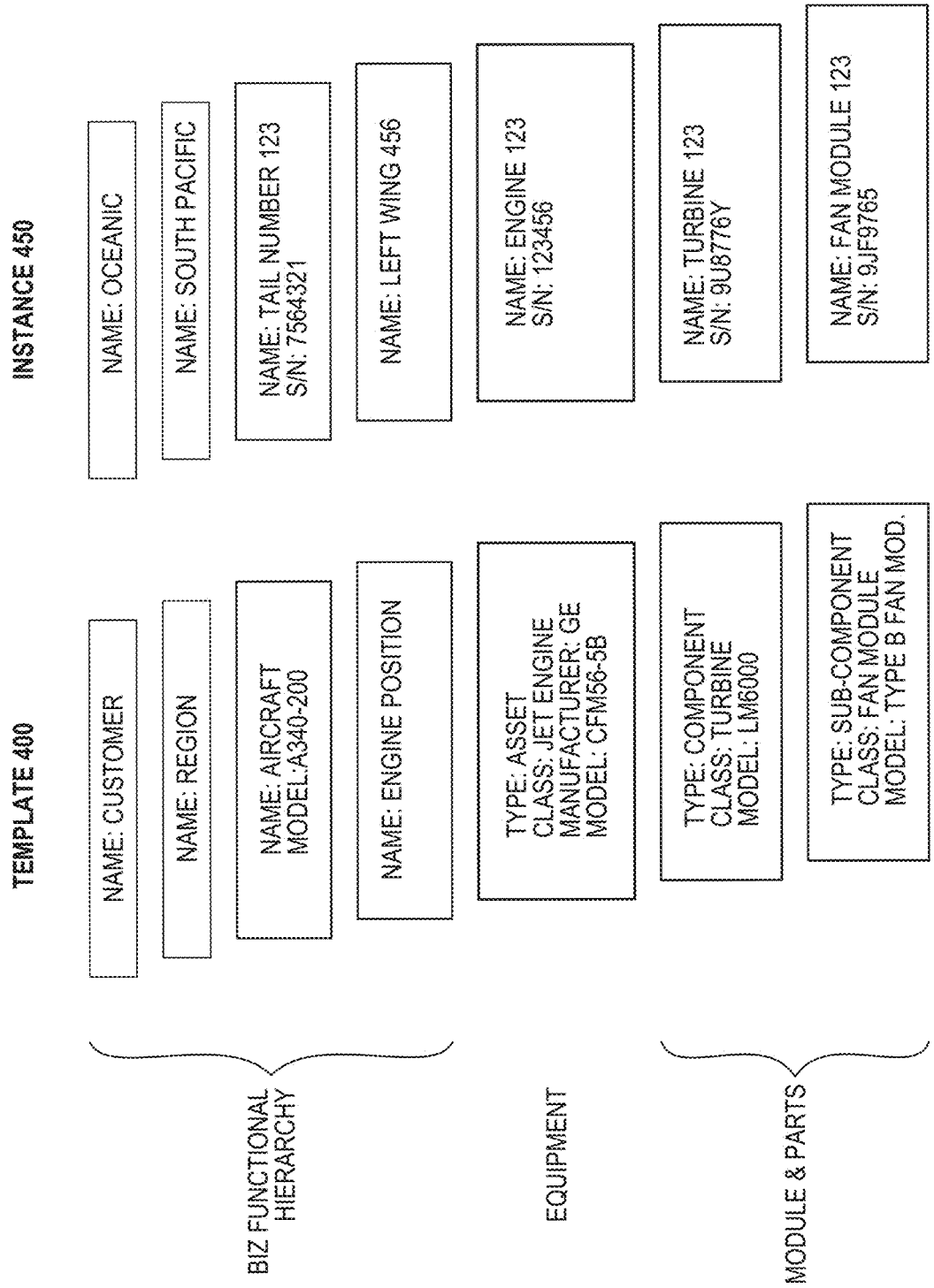
FIG. 4 is a block diagram illustrating a relationship between an example asset template and asset model instance, according to some embodiments.

FIG. 4 is a block diagram illustrating a relationship between an example asset template and an asset model instance, according to some embodiments. Shown in FIG. 4 is a portion of an equipment template 400 and a portion of an asset model instance 450 generated from the equipment template 400. In this example, the equipment template 400 represents a particular version of a jet engine—"Model: CFM56-5B"—while the asset model instance 450 represents a particular instance of the "Model: CFM56-5B"—Serial Number 123456. As shown, the equipment template 400 includes attributes such as "Customer," "Region," "Aircraft," and "Engine Position" and in the asset model instance 450 these attributes have been populated with specific values. For example, in the asset model instance 450, the value for the "Customer" attribute is listed as "Oceanic," the value for the "Region" attribute is listed as "South Pacific," the value for the "Aircraft" attribute is listed as "Tail Number 123," and the value for the "Engine Position" attribute is listed as "Left Wing 456."

Additionally, the equipment template 400 specifies placeholders for a "Turbine" component (i.e., LM6000), which includes a placeholder for "Fan Module" subcomponent—Type B Fan Module). In the model instance 450, the placeholders for the "Turbine" component and "Fan Module" subcomponent have been populated with serial numbers that uniquely identifier the real-world turbine and fan module included in the real-world instance of the "Model: CFM56-5B" represented by the asset model instance 450 (i.e., Serial Number 123456).

Figure 5:
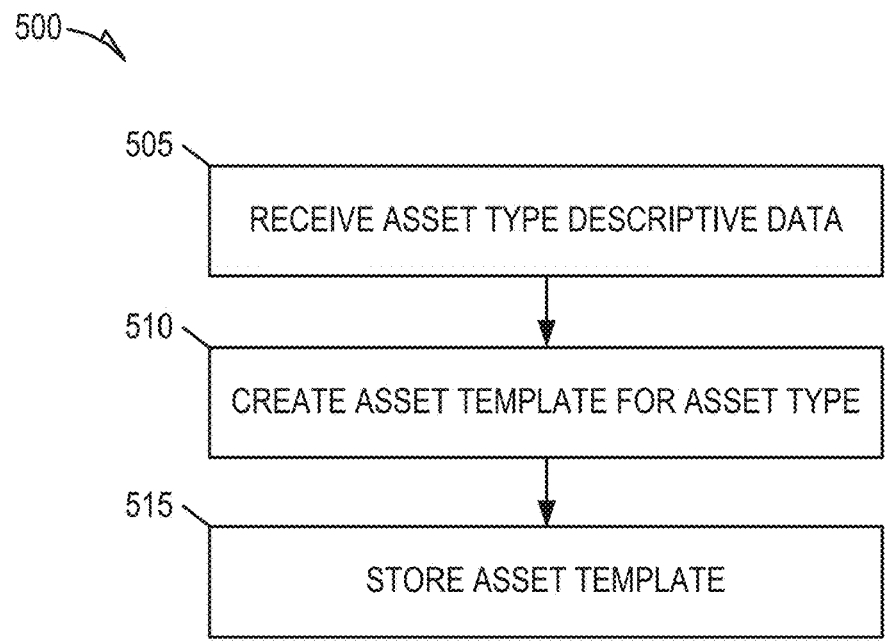
FIGS. 5-7 are flowcharts illustrating example operations of the templating engine in performing a method for generating an asset template, according to some embodiments.

FIG. 5 is a flow chart illustrating example operations of network-based ALM system 100 in performing a method 500 for generating an asset template 300. The method 500 may be embodied in computer-readable instructions for execution by a hardware component (e.g., a processor) such that the operations of the method 500 may be performed by a computing machine such as machine 900 illustrated in FIG. 9. In particular, the operations of the method 500 may be performed in part or in whole by the functional components forming network-based ALM system 100, accordingly, the method 500 is described below, by way of example with reference thereto. However, it shall be appreciated that the method 500 may be deployed on various other hardware configurations and is not intended to be limited to the network-based ALM system 100.

At operation 505, the templating engine 104 receives asset type descriptive data. The asset type descriptive data includes information describing components, subcomponents, and attributes of an asset type along with the configuration (e.g., structure and position) of components and subcomponents. The asset type may, for example, correspond to a particular version of equipment (e.g., identified by model number). The asset type descriptive data may include or correspond to a three-dimensional model of the asset type and/or a bill of materials (e.g., engineering, sales, or manufacturing) that includes a list of raw materials, sub-assemblies, intermediate assemblies, subcomponents, parts and the quantities of each needed to manufacture the asset type.

At least a portion of the asset type descriptive data (e.g., the bill of materials) may be encoded in a data file that is provided, for example, through an application or user interface. For example, in some embodiments, the asset type descriptive data may be encoded in Java Script Object Notation (JSON) file and provided to the templating engine 104 as part of an API request submitted by a client machine through either the bulk ingestion service 110 or the CRUD service 112.

In other embodiments, the asset type descriptive data may be provided to the templating engine 104 by a user of a client machine via a user interface provided to the client machine by the user interface module 102, In these embodiments, the user interface may include functionality that enables a user to upload a data file (e.g., a .dwg, .drv, .vue, or .dgn design file) that includes at least a portion of the asset type descriptive data. Further, in some embodiments, the user interface may include additional elements that allow the user to supplement the data file with additional asset type descriptive information (e.g., the asset classification and sensor measurement types). Additionally, in these embodiments, the receiving of asset type descriptive data may include prompting, via the user interface, a user to provide a three-dimensional representation of the asset type (e.g., a .dwg, .drv, .vue, or .dgn design file), and prompting, via the user interface, the user to provide a bill of materials for the asset type (e.g., encoded in a .dwg, .drv, .vue, or .dgn design file).

In an example, the asset type descriptive data describes a particular type of jet engine turbine such as a particular version, model, class, or line of a jet engine turbine (e.g., GE90-115B). Accordingly, the asset type descriptive data may include information describing components of the type of jet engine turbine such as a particular type of fan module (e.g., Type A fan module) along with subcomponent of the fan module such as a type of fan blade (e.g., Ceramix Matrix Composite fan blade) forming part of the turbine. The asset type descriptive information for the particular model of jet engine turbine may further include attributes that correspond to the type of jet engine turbine such as a customer name, a region, and an aircraft identifier.

As shown, the templating engine 104, at operation 510, creates the asset template for the asset type based on the asset type descriptive information. As noted above, the asset template is a hierarchical data structure that that specifies the components, the subcomponents, the attribute, and sensor measurements of an asset type along with the configuration (e.g., structure and placement) of the components and subcomponents for the asset type. The asset template may further include a three-dimensional representation of the asset type.

In embodiments in which the asset type descriptive information includes a bill of materials encoded in the data file, the templating engine 104 may convert the data file into a separate data object, such as a java object. In doing so, the templating engine 104 may parse the data file to identify at least a portion of the components, the subcomponents, the attributes, sensor measurements or configuration. Further, in creating the asset template the templating engine 104 may derive, through inheritance, at least a portion of the attributes or sensor measurements from the classification of the components or subcomponents identified from the bill of materials or other user input. Further details regarding the creation of the asset template are discussed below in reference to FIG. 7.

At operation 515, the templating engine 104 stores the asset template in a network-accessible database (e.g., a table) such as the template repository 116, In storing the asset template, the templating engine 104 may utilize a particular communication model or schema to communicate with the database in order to cause the asset template to be added to the database.

Figure 6:
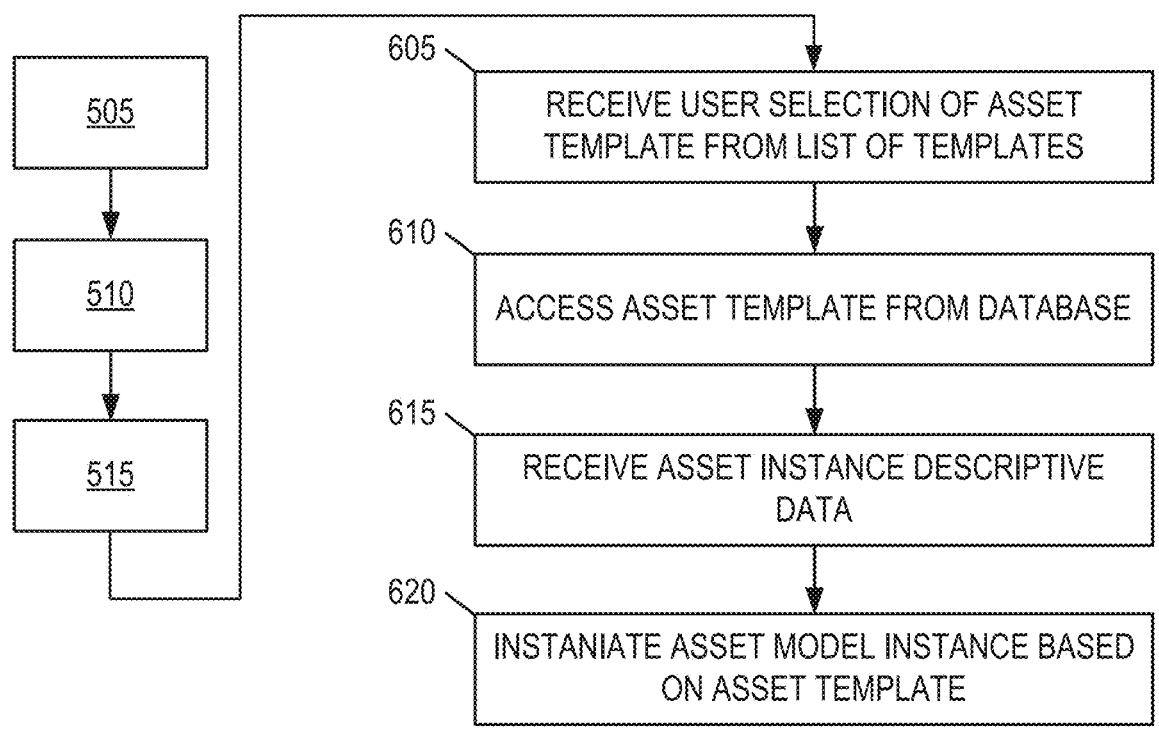

The templating engine 104 stores the asset template in the database so that the modeling engine 106 can later create model instances from the asset template. For example, as shown in FIG. 6, the method 500 may, in some embodiments, include operations 605, 610, 615 and 620. The operations 605, 610, 615, and 620 may be performed subsequent to operation 515, consistent with some embodiments.

At operation 605, the user interface module 102 receives a user selection of the asset template from among a list of asset templates displayed (e.g., on a display of a client machine) for selection. In response to receiving the user selection of the asset template, the modeling engine 106 accesses the asset template from the network-based database (e.g., template repository 118), at operation 610.

The user interface module 102, at operation 615, receives asset instance descriptive data. The asset instance descriptive data includes information describing a real-world instance of the asset type such as a particular piece of equipment that is identifiable by serial number. Depending on the asset type, the asset instance descriptive data may include information such as serial numbers or other unique identifiers of components or subcomponents as well as values for the attributes. It shall be noted that one of ordinary skill in the art may also refer to the combination of attribute and value as an attribute key-value pair.

At operation 620, the modeling engine 106 instantiates an asset model instance based on the asset template using the asset instance descriptive data. The asset model instance is a hierarchical data structure that represents the real-world instance of the asset type (e.g., a particular piece of equipment). The modeling engine 106 instantiates the asset model instance by populating the asset template placeholders for components, subcomponents, attributes, and sensor measurements using the instance descriptive data. For example, the modeling engine 106 may populate the component and subcomponent types of the asset template with the serial numbers or other unique identifiers of the components and subcomponents. Additionally, the modeling engine 106 may populate the attributes with specific values. Following the jet engine turbine example from above, the modeling engine 106 may populate the customer attribute with "Oceanic Airline," the region attribute with "South Pacific Ocean," and the aircraft identifier with "Tail Number 815." Additionally, the modeling engine 106 may populate the sensor measurements with sensor addresses or identifiers that enable the network-based ALM system 100 to retrieve information from the sensors.

Figure 7:
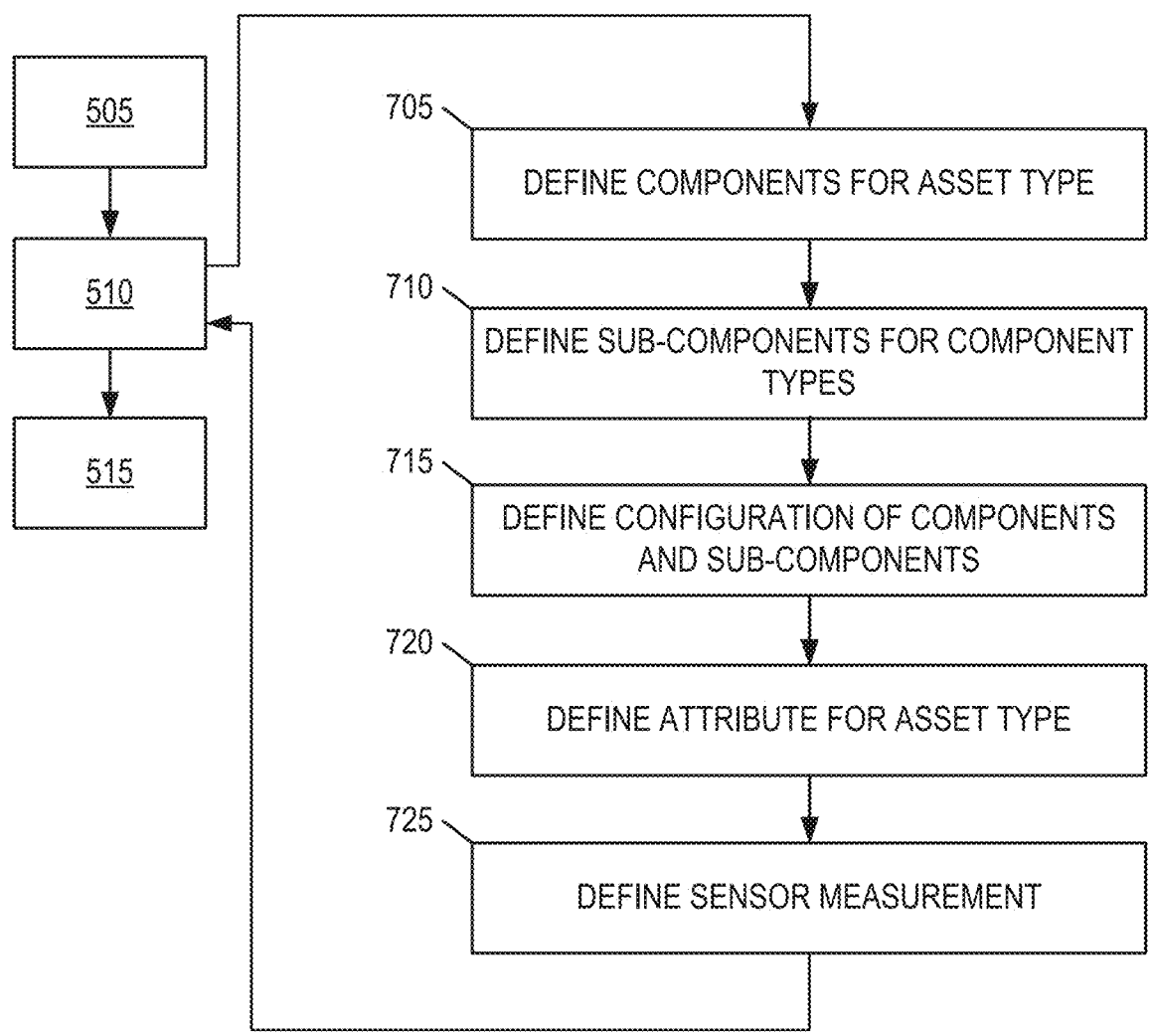

As shown in FIG. 7, the method 500 may further include operations 705, 710, 715, 720, and 725, consistent with some embodiments. The operations 705, 710, 715, 720, and 725 may be performed as part of (e.g., a subroutine) operation 510, where the templating engine 104 creates the asset template.

At operation 705, the templating engine 104 defines components for the asset type. The templating engine 104 defines the components based on the asset type descriptive information. For example, the templating engine 104 may define the components based on an analysis of a bill of materials included in the asset type descriptive information. The defining of the components for the asset type may further include mapping components identified from the asset type descriptive information to one or more asset classifications (e.g., stored in the classification repository 116). In some instances, a component of the asset type may correspond to a preexisting asset template. In these instances, the defining of the components for the asset template includes associating the preexisting asset template with the asset template. As the preexisting asset template is a component of the asset type, the associating may include creating a parent-child relationship where the asset template being generated is the parent and the preexisting asset template is the child.

At operation 710, the templating engine 104 defines subcomponents for the components of the asset type. The templating engine 104 defines the subcomponents based on the asset type descriptive information. For example, as with the components, the templating engine 104 may define at least a portion the subcomponents based on an analysis of a bill of materials included in the asset type descriptive information. In some embodiments, the templating engine 104 may further define a portion of the subcomponents based on the mapping of the components to asset classifications. The defining of the subcomponents for the components may further include mapping subcomponents identified from the asset type descriptive information to one or more asset classifications (e.g., stored in the classification repository 116).

As shown, the templating engine 104 defines a configuration of the component types and subcomponent types based on the asset type descriptive information, at operation 715. For example, the templating engine 104 may define the configuration of the components and subcomponents based on an analysis the bill of materials. The configuration of the components and subcomponents includes a structure and position of the component and subcomponent types within the asset type.

The templating engine 104, at operation 720, defines attributes for the asset template. As mentioned above, those of ordinary skill in the art may recognize that the attribute types for the asset type correspond to the attribute keys for attribute key-value pairs. The templating engine 104 may define the attributes for the asset template based on attributes inherited from the asset classification, based on an analysis of the bill of materials, or based on a combination of both. For example, as noted above, the asset classifications include attributes common to components or subcomponents of a particular class. Accordingly, the templating engine 104 may define attributes for each of the components and subcomponents based on attributes that are common to the classification of each of components and subcomponents. The templating engine 104 may define global attributes (e.g., attributes applicable to the asset type as a whole) based on an analysis of the bill of materials or other user supplied information.

At operation 725, the templating engine 104 defines sensor measurement types for the asset type. The templating engine 104 may define the sensor measurement types for the asset template based on the asset classification, based on the bill of materials, or based on other user input supplied via an interface (e.g., user or application) to the network-based ATM system 100. The templating engine 104 may define one or more sensor measurements for each sensor included in the asset type. The templating engine 104 may further associate sensor measurements with particular components or subcomponents. For example, fan blades of a fan module may have an attached sensor that measures vibration and speed of the fan blade. In this example, the templating engine 104 may define sensor measurements for speed and vibration, and associate each of the sensor measurements with each fan blade of the fan module.

FIGS. 8A-8F are interface diagrams illustrating example interactive interfaces provided by the user interface module 102 of the network-based ALM system 100, according to some embodiments. The user interface module 102 may cause any one of the interactive interfaces to be displayed on a display of a client machine, for example, by transmitting a set of machine-readable instructions to the client device that causes the client device to present the UI on a display of the client device. The set of machine-readable instructions may, for example, include presentation data (e.g., representing the UI) and a set of instructions to display the presentation data. The client device may temporarily store the presentation data to enable display of the UI.

Figure 8A:

Shown in FIG. 8A is a template catalog that includes a list of asset templates available for user selection. Templates included in the template catalog may be stored in and accessed from the template catalog. A user may select any one of the asset templates to view, edit, or delete the template.

Figure 8B:
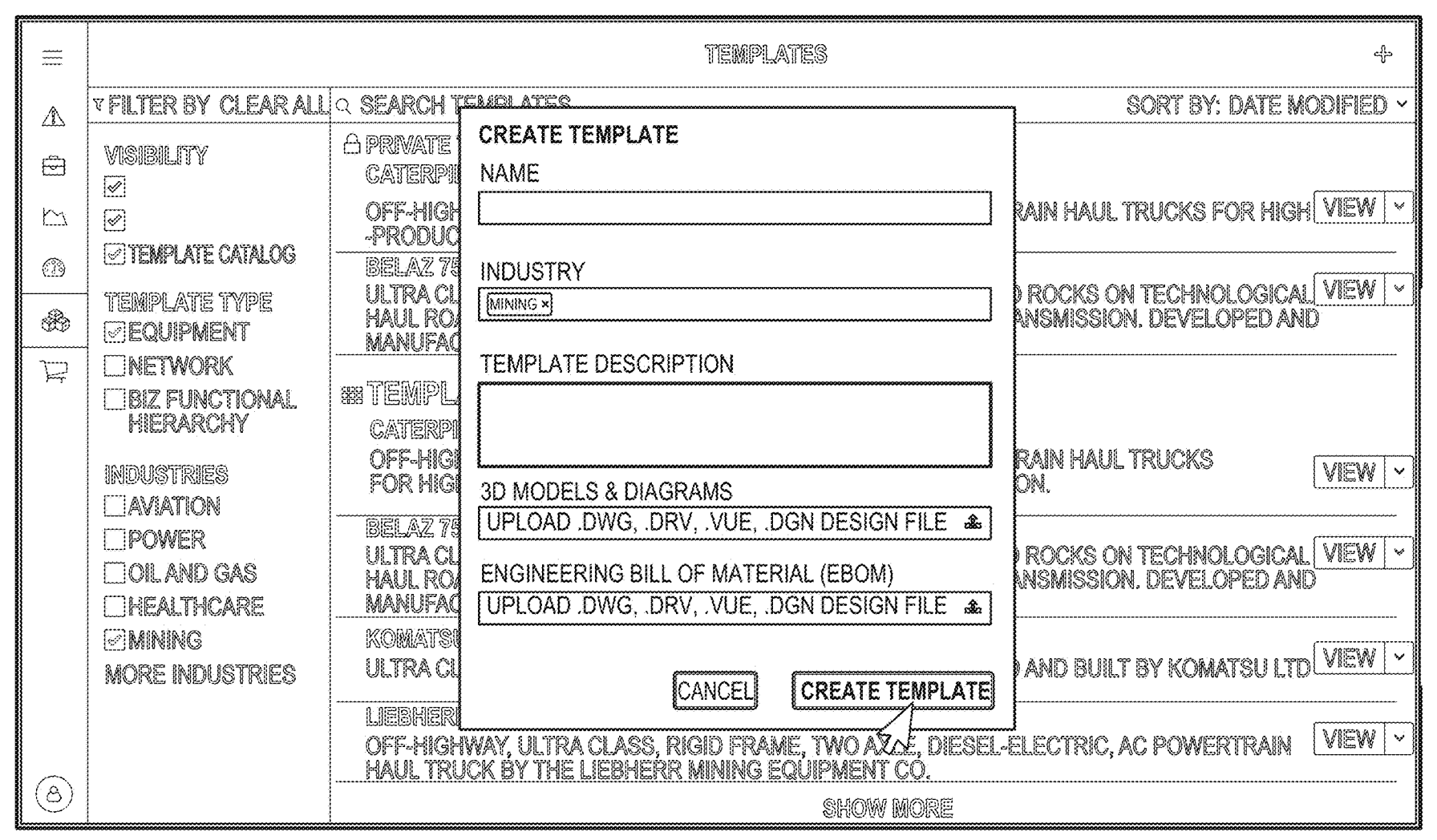

Shown in FIG. 8B, is a template creation window that enables users to create new templates. The template creation window is configured to receive asset type descriptive information. For example, the template creation window includes fields for users to specify a template name, an industry to which the template pertains, and a template description. The template creation window also includes elements that enable a user to upload data files (e.g., a .dwg, .drv, .vue, or .dgn design file) corresponding to three-dimensional models and diagrams along with a bill of materials for the corresponding asset type. The templating engine 104 uses the information input into the template creation window to generate an asset template.

Figure 8C:
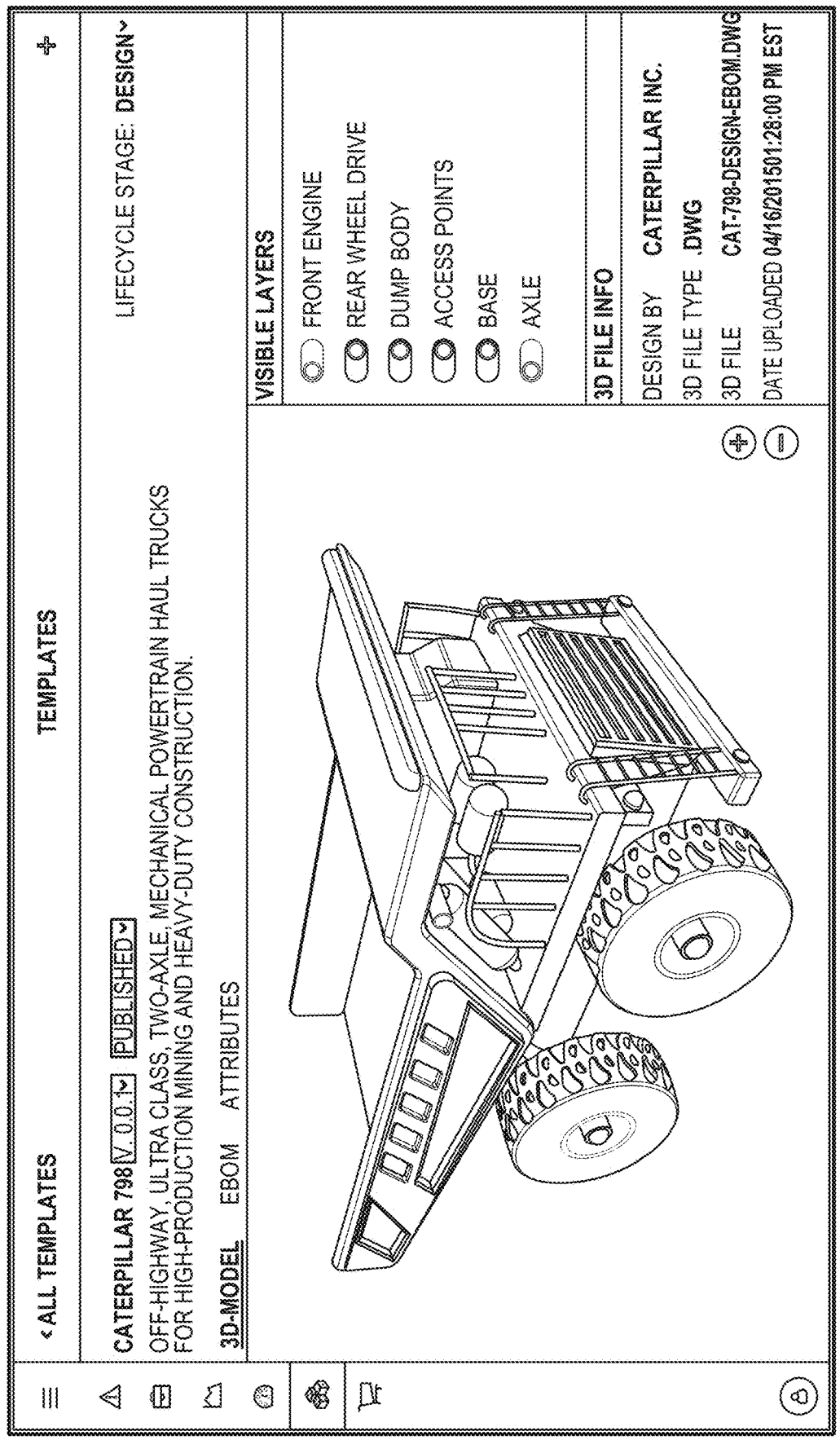

Shown in FIG. 8C is a view of an asset template corresponding to a "Caterpillar 798." In particular, the view includes a presentation of a three-dimensional model of the "Caterpillar 798" along with information about the three-dimensional model and interactive elements that allow a user to toggle between different layers of the model. From the interface illustrated in FIG. 8C, the user may also select to view the bill of materials for the "Caterpillar 798," which is illustrated in FIG. 8D.

Shown in the left-hand pane of the interface illustrated FIG. 8D is a list of components of the "Caterpillar 798" along with subcomponents of each component. The components and subcomponents are displayed in a hierarchical structure in accordance with the configuration of the components and subcomponents determined through analysis of the bill of materials. A user may select any one of the components or subcomponents to view attributes of the component or subcomponent such as a facility name, a manufacturer name, a batch number, or a manufacture date.

Figure 8E:
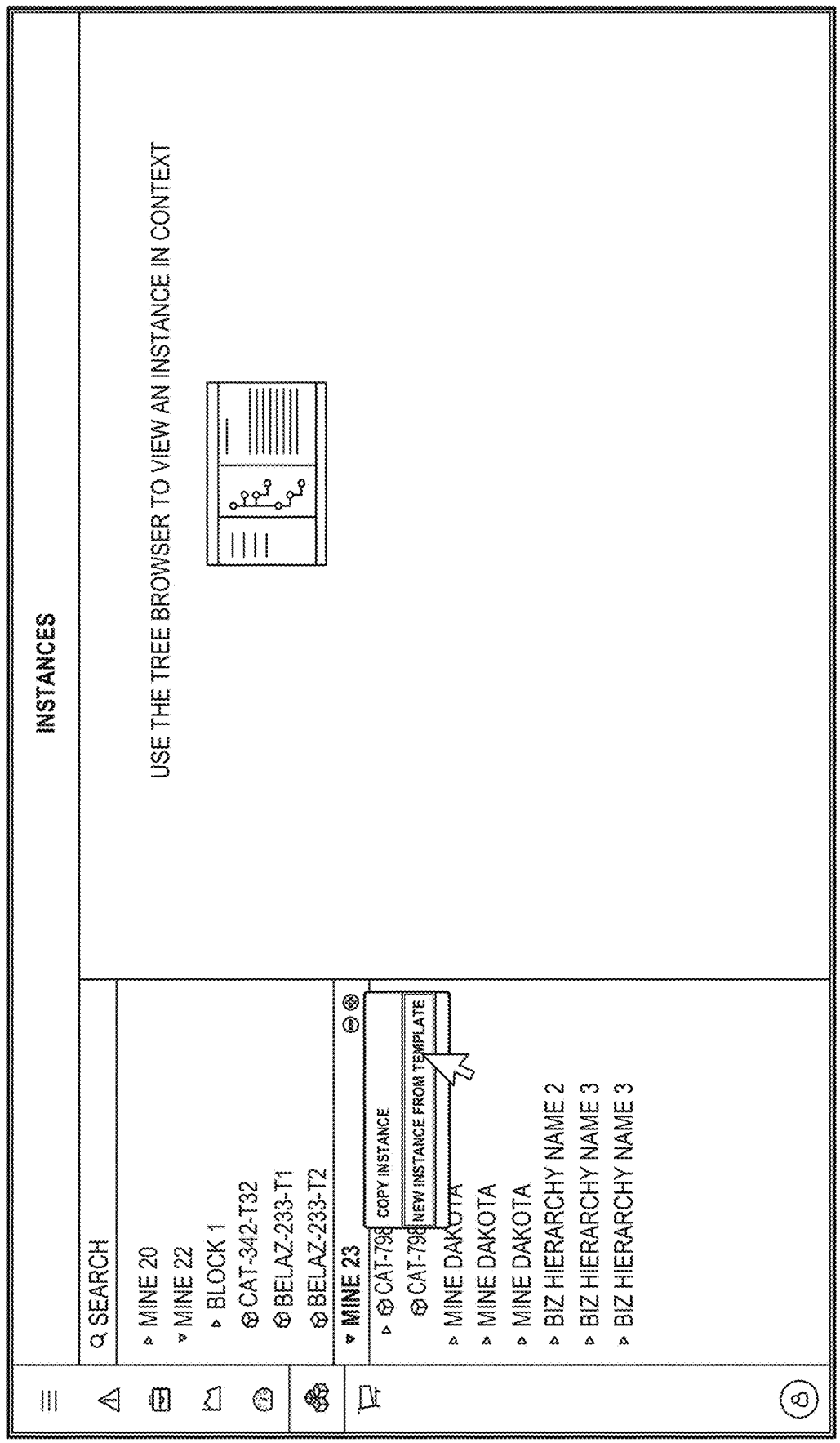

FIG. 8E illustrates a list of model instances, from which a user may select to copy the model instance or to create a new model instance from the same template. FIG. 8F illustrates a view of a model instance. The view includes a three-dimensional representation of the instance of the asset along with detailed information about the asset instance including a serial number that uniquely identifies the asset instance. As noted above, asset model instances are used to track and monitor asset instance throughout their lifecycle. Accordingly, the view also includes other information related to management of the asset instance such as coverage, utilization, and events. The view also includes a number of tabs from which the user may select to view more specific information about the asset instance. For example, illustrated in FIG. 8G is a list of events that have occurred in the lifecycle of the asset instance. As shown, the events include maintenance, repairs, and alerts that have occurred over the lifecycle of the asset. Each event is identified with a time stamp and includes a detailed description.

Figure 9:
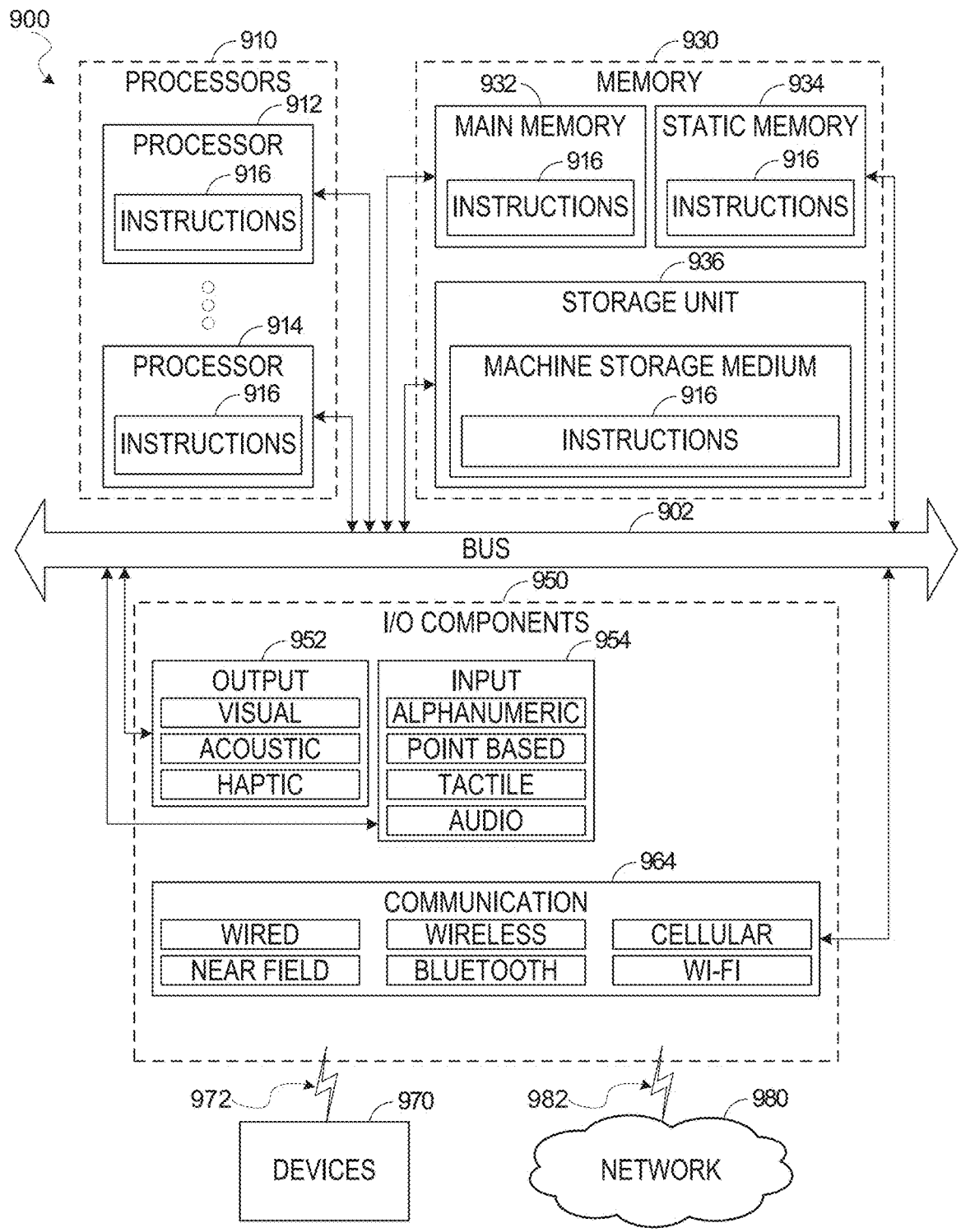
FIG. 9 is a diagrammatic representation of a machine in the example form of a computer system within which a set of instructions for causing the machine to perform any one or more of the methodologies discussed herein may be executed.

FIG. 9 illustrates a diagrammatic representation of a machine 900 in the form of a computer system within which a set of instructions may be executed for causing the machine 900 to perform any one or more of the methodologies discussed herein, according to an example embodiment. Specifically, FIG. 9 shows a diagrammatic representation of the machine 900 in the example form of a computer system, within which instructions 916 (e.g., software, a program, an application, an appllet, an app, or other executable code) for causing the machine 900 to perform any one or more of the methodologies discussed herein may be executed. For example, the instructions 916 may cause the machine 900 to execute the method 500. Additionally, or alternatively, the instructions 916 may implement the network-based ALM system 100 of FIG. 1. The instructions 916 transform the general, non-programmed machine 900 into a particular machine 900, such as a routing engine programmed to carry out the described and illustrated functions in the manner described here. In alternative embodiments, the machine 900 operates as a standalone device or may be coupled (e.g., networked) to other machines. In a networked deployment, the machine 900 may operate in the capacity of a server machine or a client machine in a server-client network environment, or as a peer machine in a peer-to-peer (or distributed) network environment. The machine 900 may comprise, but not be limited to, a server computer, a client computer, a personal computer (PC), a tablet computer, a laptop computer, a nethook, a smart phone, a mobile device, a network router, a network switch, a network bridge, or any machine capable of executing the instructions 916, sequentially or otherwise, that specify actions to be taken by the machine 900. Further, while only a single machine 900 is illustrated, the term "machine" shall also be taken to include a collection of machines 900 that individually or jointly execute the instructions 916 to perform any one or more of the methodologies discussed herein.

The machine 900 may include processors 910, memory 930, and 110 components 950, which may be configured to communicate with each other such as via a bus 902. In an example embodiment, the processors 910 (e.g., a central processing unit (CPU), a reduced instruction set computing (RISC) processor, a complex instruction set computing (CISC) processor, a graphics processing unit (GPU), a digital signal processor (DSP), an application-specific integrated circuit (ASIC), a radio-frequency integrated circuit (RFIC), another processor, or any suitable combination thereof) may include, for example, a processor 912 and a processor 914 that may execute the instructions 916, The term "processor" is intended to include multi-core processors 910 that may comprise two or more independent processors (sometimes referred to as "cores") that may execute instructions contemporaneously. Although FIG. 9 shows multiple processors, the machine 900 may include a single processor with a single core, a single processor with multiple cores (e.g., a multi-core processor), multiple processors with a single core, multiple processors with multiple cores, or any combination thereof.

The memory 930 may include a main memory 932, a static memory 934, and a storage unit 936, both accessible to the processors 910 such as via the bus 902. The main memory 932, the static memory 934, and the storage unit 936 store the instructions 916 embodying any one or more of the methodologies or functions described herein. The instructions 916 may also reside, completely or partially, within the main memory 932, within the static memory 934, within the storage unit 936, within at least one of the processors 910 (e.g., within the processor's cache memory), or any suitable combination thereof, during execution thereof by the machine 900.

The I/O components 950 may include a wide variety of components to receive input, provide output, produce output, transmit information, exchange information, capture measurements, and so on. The specific I/O components 950 that are included in a particular machine 900 will depend on the type of machine. For example, portable machines such as mobile phones will likely include a touch input device or other such input mechanisms, while a headless server machine will likely not include such a touch input device. It will be appreciated that the I/O components 950 may include many other components that are not shown in FIG. 5. The I/O components 950 are grouped according to functionality merely for simplifying the following discussion and the grouping is in no way limiting. In various example embodiments, the I/O components 950 may include output components 952 and input components 954. The output components 952 may include visual components (e.g., a display such as a plasma display panel (PDP), a light emitting diode (LED) display, a liquid crystal display (LCD), a projector, or a cathode ray tube (CRT)), acoustic components (e.g., speakers), other signal generators, and so forth. The input components 954 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components audio input components (e.g., a microphone), and the like.

Communication may be implemented using a wide variety of technologies. The I/O components 950 may include communication components 964 operable to couple the machine 900 to a network 980 or devices 970 via a coupling 982 and a coupling 972, respectively. For example, the communication components 964 may include a network interface component or another suitable device to interface with the network 980. In further examples, the communication components 964 may include wired communication components, wireless communication components, cellular communication components, and other communication components to provide communication via other modalities. The devices 970 may be another machine or any of a wide variety of peripheral devices (e.g., a peripheral device coupled via a universal serial bus (USB)).

Executable Instructions and Machine Storage Medium

The various memories (e.g., 930, 932, 934, and/or memory of the processor(s) 910) and/or the storage unit 936 may store one or more sets of instructions and data structures (e.g., software) embodying or utilized by any one or more of the methodologies or functions described herein. These instructions, when executed by the processor(s) 910, cause various operations to implement the disclosed embodiments.

As used herein, the terms "machine-storage medium," "device-storage medium," and "computer-storage medium" mean the same thing and may be used interchangeably in this disclosure. The terms refer to a single or multiple storage devices and/or media (e.g., a centralized or distributed database, and/or associated caches and servers) that store executable instructions 916 and/or data. The terms shall accordingly be taken to include, but not be limited to, solid-state memories, and optical and magnetic media, including memory internal or external to processors 910. Specific examples of machine-storage media, computer-storage media, and/or device-storage media include non-volatile memory, including by way of example semiconductor memory devices, e.g., erasable programmable read-only memory (EPROM), electrically erasable programmable read-only memory (EEPROM), field-programmable gate arrays (FPGAs), and flash memory devices; magnetic disks such as internal hard disks and removable disks; magneto-optical disks; and CD-ROM and DVD-ROM disks. The terms "machine-storage media," "computer-storage media," and "device-storage media" specifically exclude carrier waves, modulated data signals, and other such media, at least some of which are covered under the term "signal medium" discussed below.

Transmission Medium

In various example embodiments, one or more portions of the network 980 may be an ad hoc network, an intranet, an extranet, a virtual private network (VPN), a local-area network (LAN), a wireless LAN (WLAN), a wide-area network (WAN), a wireless WAN (WWAN), a metropolitan-area network (MAN), the Internet, a portion of the Internet, a portion of the public switched telephone network (PSTN), a plain old telephone service (POTS) network, a cellular telephone network, a wireless network, a Wi-Fi® network, another type of network, or a combination of two or more such networks. For example, the network 980 or a portion of the network 980 may include a wireless or cellular network, and the coupling 982 may be a Code Division Multiple Access (CDMA) connection, a Global System for Mobile communications (GSM) connection, or another type of cellular or wireless coupling. In this example, the coupling 982 may implement any of a variety of types of data transfer technology, such as Single Carrier Radio Transmission Technology (1×RTT), Evolution-Data Optimized (EVDO) technology, General Packet Radio Service (CPRS) technology, Enhanced Data rates for GSM Evolution (EDGE) technology, third Generation Partnership Project (3GPP) including 3G, fourth generation wireless (4G) networks, Universal Mobile Telecommunications System (UNITS), High-Speed Packet Access (HSPA), Worldwide Interoperability for Microwave Access (WiMAX) Long Term Evolution (LTE) standard, others defined by various standard-setting organizations, other long-range protocols, or other data transfer technology.

The instructions 916 may be transmitted or received over the network 980 using a transmission medium via a network interface device (e.g., a network interface component included in the communication components 964) and utilizing any one of a number of well-known transfer protocols (e.g., hypertext transfer protocol (HTTP)). Similarly, the instructions 916 may be transmitted or received using a transmission medium via the coupling 972 (e.g., a peer-to-peer coupling) to the devices 970. The terms "transmission medium" and "signal medium" mean the same thing and may be used interchangeably in this disclosure. The terms "transmission medium" and "signal medium" shall be taken to include any intangible medium that is capable of storing, encoding, or carrying the instructions 916 for execution by the machine 900, and include digital or analog communications signals or other intangible media to facilitate communication of such software. Hence, the terms "transmission medium" and "signal medium" shall be taken to include any form of modulated data signal, carrier wave, and so forth. The term "modulated data signal" means a signal that has one or more of its characteristics set or changed in such a manner as to encode information in the signal.

Computer-Readable Medium

The terms "machine-readable medium," "computer-readable medium," and "device-readable medium" mean the same thing and may be used interchangeably in this disclosure. The terms are defined to include both machine-storage media and transmission media. Thus, the terms include both storage devices/media and carrier waves/modulated data signals.

The various operations of example methods described herein may be performed, at least partially, by one or more processors that are temporarily configured (e.g., by software) or permanently configured to perform the relevant operations. Similarly, the methods described herein may be at least partially processor-implemented. For example, at least some of the operations of a method may be performed by one or more processors. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

Although the embodiments of the present disclosure have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom; such that structural and logical substitutions and changes may be made without departing from the scope of this disclosure. This Detailed Description, therefore; is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein; it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent, to those of skill in the art, upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, or process that includes elements in addition to those listed after such a term in a claim is still deemed to fall within the scope of that claim.

What is claimed is:

1. A system comprising:
   an asset that is operating to perform an industrial operation, the asset including a sensor;
   a user interface;
   one or more processors of a machine; and
   a machine-readable medium storing instructions that, when executed by the one or more processors, cause the machine to perform operations comprising:
      receiving, from a client machine, asset type descriptive data that describes an asset type;
      creating an asset template for the asset type based on the asset type descriptive data, the asset template comprising a hierarchical data structure that specifies one or more components of the asset type and a configuration of the one or more components, the creating of the asset template comprising:
         defining the one or more components of the asset type based on the asset type descriptive information;
         defining a configuration of the one or more components of the asset type based on the asset type descriptive information, the configuration of the one or more components of the asset type including a structure and position of the one or more components within the asset type;
         storing the asset template for the asset type in a network-accessible database; and
         defining a sensor measurement associated with the asset type, the sensor measurement being associated with at least one of the one or more components;
   wherein the operations further comprise accessing, from the network-based database, the asset template based on user selection of the asset template from among a plurality of asset templates stored in the network-accessible database; and
   instantiating an asset model instance that represents the asset by populating the asset template;
   wherein the processor is configured to perform the following actions: configure a parameter of the asset, monitor the sensor of the asset according to the sensor measurement, and create a report of the performance of the asset, wherein the actions are performed at least in part by analyzing the asset model instance;
   wherein the user interface is configured to present to users information associated with the asset model instance including maintenance events, repairs, and alerts associated with the asset model instance.

2. The system of claim 1, wherein the creating of the asset template further comprises:
   mapping each of the one or more components to one of a plurality of asset classifications, each asset classification comprising a set of attributes common to an asset class; and
   defining attributes of the asset type, the defining of the attributes for the asset type including defining attributes of the one or more components based on the asset classification corresponding to each of the one or more components.

3. The system of claim 2, wherein the creating of the asset template for the asset type further comprises defining one or more subcomponents of at least one of the one or more components.

4. The system of claim 3, wherein:
   the creating of the asset template for the asset type further comprises mapping each of the one or more subcomponents to one of the plurality of asset classifications, and
   the defining of attributes of the asset type includes defining attributes of the one or more subcomponents.

5. The system of claim 2, wherein the populating of the asset template comprises defining a particular instance of the one or more component types.

6. The system of claim 1, wherein:
   the asset type descriptive information includes a bill of materials for the asset type;
   the defining of the one or more component types of the asset types includes identifying the one or more component types from the bill of materials.

7. The system of claim 1, wherein the defining of the one or more component types of the asset type comprises associating an additional asset template with the asset type.

8. The system of claim 1, wherein the receiving of the asset type descriptive information comprises receiving, via an interface, a bill of materials.

9. The system of claim 8, wherein the creating of the asset template further comprises parsing the bill of materials to identify the one or more components and the configuration of the one or more components.

10. The system of claim 8, wherein:
    the bill of materials is received via an application programming interface (API);
    the data file is encoded in a Java Script Object Notation (JSON) file; and
    creating the asset template includes converting the JSON file to a Java class object.

11. The system of claim 1, wherein:
    the input data is received via the user interface; and
    the operations further comprise:
       prompting, via the user interface, a user to provide a three-dimensional representation of the asset type; and
       prompting, via the user interface, the user to provide an engineering bill of materials for the asset type.

12. A method comprising:
    operating an asset to perform an industrial operation, the asset including a sensor;
    receiving, from a client machine, asset type descriptive data that describes an asset type;
    creating an asset template for the asset type based on the asset type descriptive data, the asset template comprising a hierarchical data structure that specifies one or more components of the asset type and a configuration of the one or more components, the creating of the asset template comprising:

defining the one or more components of the asset type based on the asset type descriptive information;

defining a configuration of the one or more components of the asset type based on the asset type descriptive information, the configuration of the one or more components of the asset type including a structure and position of the one or more components within the asset type;

defining attributes of the asset type based in part on an asset classification associated with each of the one or more components;

storing the asset template for the asset type in a network-accessible database; and defining a sensor measurement associated with the asset type, the sensor measurement being associated with at least one of the one or more components;

accessing, from the network-based database, the asset template based on user selection of the asset template from among a plurality of asset templates stored in the network-accessible database;

instantiating an asset model instance that represents the asset by populating the asset template wherein the processor performs the following actions: configure a parameter of the asset, monitor the sensor of the asset according to the sensor measurement, and create a report of the performance of the asset, wherein the actions are performed at least in part by analyzing the asset model instance;

wherein a user interface is configured to present to users information associated with the asset model instance including maintenance events, repairs, and alerts associated with the asset model instance.

13. The method of claim 12, wherein the creating of the asset template further comprises mapping each of the one or more components to one of a plurality of asset classifications, each asset classification comprising a set of attributes common to an asset class.

14. The method of claim 13, wherein the creating of the asset template further comprises defining one or more subcomponents of at least one of the one or more components, wherein the defining attributes of the asset type includes:
defining attributes of the one or more components, and
defining attributes of the one or more subcomponents.

15. The method of claim 12, wherein the creating of the asset template for the asset type further comprises defining a sensor measurement associated with the asset type, the sensor measurement being associated with at least one of the one or more components.

16. The method of claim 12, wherein:
the receiving of the asset type descriptive information comprises receiving, via the user interface, a bill of materials, and the creating of the asset template further comprises parsing the bill of materials to identify the one or more components and the configuration of the one or more components.

17. A machine-storage medium embodying instructions that, when executed by at least one processor of a machine, cause the machine to perform operations comprising:

receiving, from a client machine, asset type descriptive data that describes an asset type;

wherein an asset that is operating to perform an industrial operation, the asset including a sensor;

creating an asset template for the asset type based on the asset type descriptive data, the asset template comprising a hierarchical data structure that specifies one or more components of the asset type and a configuration of the one or more components, the creating of the asset template comprising:

defining the one or more components of the asset type based on the asset type descriptive information;

defining a configuration of the one or more components of the asset type based on the asset type descriptive information, the configuration of the one or more components of the asset type including a structure and position of the one or more components within the asset type;

defining attributes of the asset type based in part on an asset classification associated with each of the one or more components;

storing the asset template for the asset type in a network-accessible database;

defining a sensor measurement associated with the asset type, the sensor measurement being associated with at least one of the one or more components;

wherein the operations for comprise accessing, from the network-based database, the asset template based on user selection of the asset template from among a plurality of asset templates stored in the network-accessible database; and instantiating an asset model instance that represents the asset by populating the asset template wherein the processor performs the following actions: configure a parameter of the asset, monitor the sensor of the asset according to the sensor measurement, and create a report of the performance of the asset, wherein the actions are performed at least in part by analyzing the asset model instance;

wherein a user interface is configured to present to users information associated with the asset model instance including maintenance events, repairs, and alerts associated with the asset model instance.

\* \* \* \* \*